United States Patent
Loboda et al.

(10) Patent No.: US 7,189,664 B2
(45) Date of Patent: Mar. 13, 2007

(54) METHOD FOR PRODUCING HYDROGENATED SILICON-OXYCARBIDE FILMS

(75) Inventors: Mark Jon Loboda, Midland, MI (US); Byung Keun Hwang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/543,672

(22) PCT Filed: Jan. 26, 2004

(86) PCT No.: PCT/US2004/002210

§ 371 (c)(1), (2), (4) Date: Jul. 28, 2005

(87) PCT Pub. No.: WO2004/077543

PCT Pub. Date: Sep. 10, 2004

(65) Prior Publication Data

US 2006/0148252 A1    Jul. 6, 2006

(51) Int. Cl.
*H01L 21/469* (2006.01)

(52) U.S. Cl. ............. 438/780; 438/781; 438/789; 257/E21.17

(58) Field of Classification Search ............. 438/763, 438/780, 30
See application file for complete search history.

(56) References Cited

U.S. PATENT DOCUMENTS

| | | | |
|---|---|---|---|
| 5,011,760 A | 4/1991 | Yamaguchi et al. | |
| 5,384,289 A | 1/1995 | Westmoreland | |
| 5,926,740 A * | 7/1999 | Forbes et al. | 438/763 |
| 6,159,871 A | 12/2000 | Loboda et al. | |
| 6,287,990 B1 * | 9/2001 | Cheung et al. | 438/780 |
| 6,440,876 B1 | 8/2002 | Wang et al. | |
| 6,469,540 B2 * | 10/2002 | Nakaya | 326/41 |
| 6,781,148 B2 * | 8/2004 | Kubota et al. | 257/40 |
| 2002/0173172 A1 | 11/2002 | Loboda et al. | |

FOREIGN PATENT DOCUMENTS

EP    0 774 533 A    5/1997

OTHER PUBLICATIONS

Gerault, J.P. et al: "X-ray photoelectron spectroscopy and Raman spectroscopy investigations of amorphous $Si_xC_{1-x}(H)$ coatings obtained by chemical vapor deposition from thermally labile organosilicon compounds" Thin Solid Films (1983), 101 (1), 83-96, XP002283721.
Laane, J.: J. Am. Chem. Soc. 89, 114(1967).

* cited by examiner

*Primary Examiner*—Michael Lebentritt
*Assistant Examiner*—Elias Ullah
(74) *Attorney, Agent, or Firm*—Sharon K. Brady

(57) ABSTRACT

A method for producing hydrogenated silicon oxycarbide (H:SiOC) films having low dielectric constant. The method comprises using plasma-assisted polymerization to react a cyclic silane compound containing at least one strained silicon bond to produce the films. The resulting films are useful in the formation of semiconductor devices.

23 Claims, No Drawings

METHOD FOR PRODUCING HYDROGENATED SILICON-OXYCARBIDE FILMS

CROSS REFERENCE TO RELATED APPLICATIONS

This application is a U.S. national stage filing under 35 U.S.C. §371 of PCT Application No. PCT/US2004/002210 filed on 26 Jan. 2004, currently pending, which claims the benefit of U.S. patent application Ser. No. 10/375516 filed 26 Feb. 2003, now abandoned under 35 U.S.C. §120. PCT Application No. PCT/US2004/002210 and U.S. patent application Ser. No. 10/375516 are hereby incorporated by reference.

This invention is a method for producing hydrogenated silicon oxycarbide (H:SiOC) films having low dielectric constant. The method comprises using plasma-assisted polymerization to react a cyclic silane compound containing at least one strained silicon bond to produce the films. The resulting films are useful in the formation of semiconductor devices.

The use of chemical vapor deposition (CVD) to produce $SiO_2$, SiNC:H or SiC:H or SiC:O:H thin films on semiconductor devices from silicon-containing materials such as silane ($SiH_4$), tetraethyl orthosilicate (TEOS), and methyl-containing silanes such as trimethylsilane has been disclosed in the art. Chemical vapor deposition processes typically comprise introducing the gaseous silicon-containing material and a non-Si containing reactive gas-into a reaction chamber containing the semiconductor substrate. An energy source such as thermal or plasma induces the reaction between the silicon-containing material and reactive gas thereby resulting in the deposition of the thin film of $SiO_2$, SiNC:H or SiC:H or SiC:O:H on the semiconductor device. Plasma enhanced chemical vapor deposition (PECVD) is typically carried out at low temperatures (<500° C.) thereby making PECVD a suitable means for producing dielectric and passivation films on semiconductor devices.

With the industry requirement to minimize the electrical resistance-capacitance (RC) delay associated with the circuit interconnections, new low permittivity dielectrics are required for use as isolation materials between adjacent conductors. While many candidate film materials exist with relative dielectric constant k, in the range 2.5<k<3.5, few have lower permittivity. Among the materials with k<2.5 are amorphous carbon alloys, fluorinated amorphous carbon alloys, and forms of porous silicon oxide.

The typical amorphous carbon alloy films have been shown to have inadequate thermal stability, often decomposing at temperatures above 200° C. It has also been shown that it is difficult to obtain good adhesion between carbon alloys and the metal films used to form the circuit interconnections. It is proposed that this problem can be overcome by the use of a reactive gas comprising a silane compound having a strained silicon bond environment. The approach is to create a carbon based film with some minimal Si content. The presence of the Si allows the formation of a native Si—O siloxane or silicon oxide on the film surface, which improves adhesion compared to an all carbon surface as is found in a-C:H, and a-C:F:H and Teflon based films.

U.S. Pat. No. 6,440,876 to Wang et al. discloses the use of a Si—O—C in-ring cyclic siloxane precursor compound in the formation of a film having a dielectric constant, k, of less than 2.5.

The use of silacyclobutanes in forming amorphous SiC films have been described in U.S. Pat. No. 5,011,706 to Tarhay et al. This patent discloses a method of forming a continuous coating of amorphous silicon carbide on the surface of articles by plasma enhanced chemical vapor deposition. The chemical vapor comprises a silicon containing cyclobutane.

It is an object of this invention to provide a method for producing low dielectric permittivity films of hydrogenated silicon oxycarbide by plasma assisted polymerization of a cyclic silane compound containing at least one strained silicon bond.

This invention pertains to a method of producing thin films of hydrogenated silicon oxycarbide (H:SiOC) having low dielectric permittivity on substrates, preferably semiconductor devices. The method comprises the plasma-assisted polymerization of a reactive gas mixture comprising a cyclic silane compound containing at least one strained silicon bond ("cyclic silane compound") and an oxygen providing gas. These films have a low dielectric constant and are particularly suited as interlayer dielectrics.

This invention pertains to a method for producing hydrogenated silicon oxycarbide films on substrate. Typical substrates include but are not limited to, semiconductor substrates, liquid crystal devices, a light emitting diode display device, and an organic light emitting display device. The method for producing the films comprises the plasma assisted polymerization of a reactive gas mixture comprising a cyclic silane compound having at least one strained silicon bond ("cyclic silane compound") and an oxygen providing gas.

By "semiconductor substrate" it is meant to include, but not be limited to, silicon based devices and gallium arsenide based devices intended for use in the manufacture of a semiconductor components including focal plane arrays, opto-electronic devices, photovoltaic cells, optical devices, transistor-like devices, 3-D devices, silicon-on-insulator devices, super lattice devices and the like. The semiconductor substrates may contain one or more layers of wiring. The semiconductor substrate may also be those substrates prior to the formation of any wiring layers.

Cyclic silane compounds are those compounds where one or more silicon atoms are contained within at least one ring structure that does not include an oxygen atom in the ring structure. Such compounds must have at least one ring and each ring must have a minimum of three substituent atoms wherein at least one of the substituent atoms are Si and each ring must not contain an oxygen atom. Examples of cyclic silane compounds include silicon-containing cyclobutanes, silicon-containing cyclopentanes, silicon-containing cyclohexanes, sila-5-spiro[4,4]nona-2,7-diene, bi-cyclic compounds and related materials.

Silicon-containing cyclobutanes with one silicon atom include compounds represented by the formula

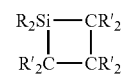

where each R is independently selected from the group consisting of hydrogen, fluorine, and hydrocarbon radicals having 1 or more carbon atoms and each R' is independently selected from the group consisting of hydrogen and hydrocarbon radicals having 1 or more carbon atoms. Typically any hydrocarbon radicals will have 1 to 4 carbon atoms. For example, useful silicon-containing cyclobutanes include the parent compound silacyclobutane ($H_2SiC_3H_6$) and derivatives such as 1,1-difluorosilacyclobutane, 1-methylsilacyclobutane, 1,1-dimethylsilacyclobutane, 1,1-ethylmethylsilacyclobutane, 1-butylsilacyclobutane, 2,4-dimethylsilacyclobutane, 3,3-diethylsilacyclobutane, and 3,3-ethylpropylsilacyclobutane.

Silicon-containing cyclobutanes with two silicon atoms include compounds represented by the formula $$\begin{array}{c} R_2Si\text{---}CR'_2 \\ | \quad\quad | \\ R'_2C\text{---}SiR'_2 \end{array}$$

where each R and R' has the same meaning as described previously. For example, useful silicon-containing cyclobutanes include the parent compound 1,3-disilacyclobutane and derivatives such as 1,1,3,3-tetrafluoro-1,3-disilacyclobutane, 1-methyl-1,3-disilacyclobutane, 1,3-dimethyl-1,3-disilacyclobutane, 1,1-ethylmethyl-1,3-disilacyclobutane, 1-butyl-1,3-disilacyclobutane, 2,4-dimethyl-1,3-disilacyclobutane, 2,2-diethyl-1,3-disilacyclobutane, and 2,4-ethylpropyl-1,3-disilacyclobutane.

The above silacyclobutane and 1,3-disilacyclobutane as well as their derivatives are known materials and methods for their production are known in the art. For example, the preparation of silacyclobutane from 1,1-dichlorosilacyclobutane by lithium aluminum hydride reduction is described by J. Laane, J. Am. Chem. Soc. 89, 1144 (1967).

Other cyclic silane compounds include

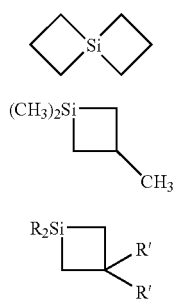

The reactive gas mixture used to produce the H:SiOC films also comprises a controlled amount of an oxygen providing gas. The oxygen may be controlled by the type of oxygen providing gas used, or by the amount of oxygen providing gas that is used. If too much oxygen is present in the deposition chamber a silicon oxide film with a stoichiometry close to $SiO_2$ will be produced and the dielectric constant will be higher than desired. If too little oxygen is present in the deposition chamber a silicon carbide film with a stoichiometry close to SiC:H will be produced.

Oxygen providing gases include, but are not limited to oxygen, air, nitrous oxide, nitric oxide, carbon monoxide, carbon dioxide, peroxides, and sulfur dioxide ($SO_2$), typically nitrous oxide. The amount of oxygen providing gas is typically 0.1 to 10 volume parts oxygen providing gas per volume part of cyclic silane compound, alternatively from 0.2 to 7 volume parts of oxygen providing gas per volume part of cyclic silane compound. One skilled in the art will be able to readily determine the amount of oxygen providing gas based on the type of oxygen providing gas and the deposition conditions.

Other materials may be present in the reactive gas mixture. For example, carrier gases such as helium or argon, dopants such as phosphine or diborane, halogens such as fluorine, halogen-containing gases such as $SiF_4$, $CF_4$, $C_3F_6$ and $C_4F_8$ or any other material that provides additional desirable properties to the film may be present.

The reactive gas mixture is introduced into a deposition chamber containing a substrate, preferably a semiconductor substrate, wherein the polymerization of the cyclic silane compound is induced resulting in the deposition of a film on the substrate wherein the film comprises hydrogen, silicon, carbon and oxygen and has a low dielectric constant ($\geq 2.0$ to $\leq 3.2$). Plasma enhanced chemical vapor deposition (PECVD) is preferred due to the low temperatures that can be used and wide use in the industry.

In PECVD the gas mixture is reacted by passing it through a plasma field. The plasmas used in such processes comprise energy derived from a variety of sources such as electric discharges, electromagnetic fields in the radio frequency or microwave range, lasers or particle beams. Generally preferred in the plasma deposition processes is the use of radio frequency (10 kHz to $10^2$ MHz) or microwave (1.0 to $10^2$ GHz) energy at moderate power densities (0.1 to 5 watts/$cm^2$). The specific frequency, power and pressure, however are generally tailored to the equipment. Preferably the films are produced using PECVD at a power of 20 to 1000 W; a pressure of 1 to 10,000 mTorr; and a temperature of 25 to 500° C. Confined, low pressure (1–5 mTorr) microwave frequency plasmas, often referred to as high density plasmas, can be combined with a RF frequency excitation in a process which helps planarize a varying surface topography during CVD growth. This process is useful in the formation of interlayer dielectrics.

The hydrogenated silicon oxycarbide films produced herein may be represented by the general formula $Si_wO_xC_yH_z$ wherein the ratio of C:Si can be in the range of about 1:1 to about 10:1 and the ratio of O:Si can be in the range of about 0.1:1 to about 1.5:1 with the balance being hydrogen. The C:Si ratio is typically determined by the C:Si ratio of the cyclic silane compound.

The films produced herein may be of varying thicknesses. Films having thicknesses of 0.01 to 10 μm may be produced by the method of this invention. Alternatively, the films have a thickness of 0.5 to 3.0 μm.

An advantage to the method of this invention is the ability to link successive growth processes to produce multilayer structures of $SiO_2$, H:SiOC and/or SiC:H for example $SiO_2$/H:SiOC/$SiO_2$ or SiC:H/H:SiOC/SiC:H, by increasing or deleting the oxygen providing gas at the appropriate time during the CVD process. It is preferred to produce discreet layers by stopping the reactive gas flow, adjusting the amount of oxygen providing gas and thereafter resuming the reactive gas flow to produce the next layer.

The films produced herein, due to the low dielectric constant, are particularly suited as interlayer dielectrics in semiconductor integrated circuit manufacturing including, but not limited to, gate dielectrics, premetal and intermetal dielectrics and passivation coatings. The films produced herein have a dielectric constant, k, of $\geq 2.0$ to $\leq 3.2$, alternatively $\geq 2.2$ to $\leq 2.8$.

The following non-limiting examples re provided so that one skilled in the art may more readily understand the invention.

EXAMPLES

Example 1

A reactive gas mixture comprising dimethylsilacyclobutane (DMSCB) and nitrous oxide, $N_2O$, (See Tables 1 for gas flow amounts) was introduced into a capacitively coupled parallel plate PECVD system at a deposition temperature was 350° C. The power, pressure conditions that the PECVD system was operated under are given in Table 1. Helium was used as a carrier gas in runs 1-1, 1-14, and 1-15. The films were formed on Si(100) wafers as the substrate. The refractive index (RI) was measure on as-deposited films. The dielectric constant (k) was measured after the films were annealed for one hour in $N_2$ ambient and 400° C. following metal deposition. The process conditions and results are in Table 1.

1MV/cm was less than $10^{-10}$ Å/cm$^2$. For the a-SiC:H film the leakage current density at 1 MV/cm was less than $10^{-10}$ Å/cm$^2$.

As can be seen by these results it is possible to produce films having low leakage current density with increased C:Si ratios.

For additional comparison, a-SiCO:H and a-SiC:H films were produced using trimethylsilane (TMS).

TABLE 1

Examples of DMSCB based a-SiCO:H films.

Dep temp = 350° C.

| Run ID | Press, (torr) | Power, (watt) | DMSCB (sccm) | $N_2O$ (sccm) | He (sccm) | Dep Rate (Å/min) | RI | Post-anneal K* Kavg* | STD |
|---|---|---|---|---|---|---|---|---|---|
| 1-1  | 3   | 300 | 150 | 125 | 75  | 3239 | 1.4    | 2.528 | 0.0283 |
| 1-2  | 3   | 300 | 100 | 50  |     | 1878 | 1.5021 | 2.651 | 0.0988 |
| 1-3  | 3   | 400 | 100 | 50  |     | 3665 | 1.4661 | 2.677 | 0.0920 |
| 1-4  | 3   | 300 | 115 | 50  |     | 1777 | 1.4955 | 2.602 | 0.1161 |
| 1-5  | 3   | 300 | 85  | 50  |     | 1929 | 1.4991 | 2.740 | 0.0110 |
| 1-6  | 3   | 250 | 100 | 50  |     | 1468 | 1.5036 | 2.593 | 0.2057 |
| 1-7  | 3.8 | 300 | 100 | 50  |     | 1803 | 1.5035 | 2.683 | 0.0390 |
| 1-8  | 2   | 300 | 100 | 700 |     | 7608 | 1.4333 | 2.604 | 0.2420 |
| 1-9  | 3   | 300 | 130 | 50  |     | 1626 | 1.4978 | 2.545 | 0.0632 |
| 1-10 | 3   | 400 | 130 | 50  |     | 2375 | 1.5155 | 2.650 | 0.0330 |
| 1-11 | 3   | 300 | 100 | 700 |     | 7482 | 1.4186 | 2.838 | 0.0546 |
| 1-12 | 1   | 300 | 100 | 50  |     | 1110 | 1.4087 | 2.793 | 0.1935 |
| 1-13 | 1   | 400 | 100 | 50  |     | 844  | 1.5154 | 3.041 | 0.1039 |
| 1-14 | 5   | 400 | 50  | 350 | 100 | 4943 | 1.3741 | 3.101 | 0.0750 |
| 1-15 | 5   | 400 | 100 | 50  | 100 | 2692 | 1.5218 | 2.583 | 0.1234 |

*The error of measured K is +0/−10%.

Example 2 (Comparative)

a-SiC:H films were produced using DMSCB as described in Example 1 except that nitrous oxide ($N_2O$) was not used in the reactive gas mixture.

TABLE 2

Examples of DMSCB a-SiC:H films.

Dep temp = 350° C.

| Run ID | Press, (torr) | Power, (watt) | DMSCB (sccm) | He (sccm) | Dep Rate (Å/min) | RI | Post annealed K* Kavg | STD |
|---|---|---|---|---|---|---|---|---|
| C2-1 | 3 | 200 | 150 | 200 | 140 | 1.7106 | 4.350 | 0.1633 |
| C2-2 | 3 | 400 | 150 | 200 | 273 | 1.7375 | 4.271 | 0.1612 |
| C2-3 | 5 | 300 | 50  | 80  | 287 | 1.6146 | 3.919 | 0.0239 |
| C2-4 | 5 | 200 | 50  | 80  | 125 | 1.6172 | 4.044 | 0.1137 |
| C2-5 | 2 | 400 | 50  | 80  | 580 | 1.7749 | 4.357 | 0.0458 |
| C2-6 | 2 | 300 | 50  | 80  | 376 | 1.783  | 4.474 | 0.1114 |

*The error of measured K is +0/−10%.

Example 3

Films produced in Run 1-15 of Example 1 and Run C2-4 of Example 2 were analyzed for composition using Rutherford Back Scattering-Hydrogen Forward Scattering (Ion Scattering Spectrometry). The results of this analysis are given in Table 3. As can be seen by these results.

The leakage current density was also measured on both films. For the a-SiCO:H film the leakage current density at

Example 4

A reactive gas mixture comprising dimethylsilacyclopentane (DMSCP) and nitrous oxide, $N_2O$, (See Tables 4 for gas flow amounts) and argon, Ar, was introduced into a capacitively coupled parallel plate PECVD system at a deposition temperature was 370° C. The power, pressure conditions that the PECVD system was operated under are given in Table 4.

The a-SiCO:H films were formed on Si(100) wafers as the substrate. The refractive index (RI) was measure on as-deposited films. The dielectric constant (k) was measured after the films were annealed for one hour in $N_2$ ambient and 400° C. following metal deposition. The process conditions and results are in Table 4.

TABLE 4

Examples of dimethylsilacyclopentane (DMSCP) based a-SiCO:H films.

Dep Temp = 370 C.

| Run ID | Press, (ton) | Power, (watt) | DMSCP, (sccm) | N2O, (sccm) | Ar, (sccm) | Dep Rate (Å/min) | RI | Post-anneal K* Kavg* | STD |
|---|---|---|---|---|---|---|---|---|---|
| 4-1 | 9 | 850 | 200 | 225 | 125 | 12021 | 1.5054 | 2.354 | 0.159 |
| 4-2 | 9 | 850 | 200 | 250 | 125 | 12792 | 1.5014 | 2.514 | 0.171 |
| 4-3 | 9 | 850 | 200 | 200 | 150 | 12063 | 1.5087 | 2.285 | 0.132 |
| 4-4 | 9 | 850 | 200 | 250 | 150 | 12957 | 1.4997 | 2.559 | 0.090 |

*The error of measured K is +0/−10%.

Example 5

A reactive gas mixture comprising dimethylsilacyclopentane (DMSCP) and helium, He, (See Table 5 for gas flow amounts) was introduced into a capacitively coupled parallel plate PECVD system at a deposition temperature was 370° C. The power, pressure conditions that the PECVD system was operated under are given in Table 5.

The a-SiC:H films were formed on Si(100) wafers as the substrate. The refractive index (RI) was measure on as-deposited films. The dielectric constant (k) was measured after the films were annealed for one hour in $N_2$ ambient and 400° C. following-metal deposition. The process conditions and results are in Table 5.

What is claimed is:

1. A chemical vapor deposition method for producing hydrogenated silicon oxycarbide films comprising
   introducing a reactive gas mixture comprising (i) a cyclic silane compound selected from the group consisting of silicon-containing cyclobutanes, silicon-containing cyclopentanes, silicon-containing cyclohexanes, sila-5-spiro[4,4]nona-2,7-diene, and bi-cyclic compounds wherein said cyclic silane compound has one or more silicon atoms contained within at least one ring structure that does not include an oxygen atom in the ring structure; and (ii) an oxygen providing gas into a deposition chamber containing a substrate and

TABLE 5

Examples of dimethylsilacyclopentane (DMSCP) based a-SiC:H films.

Dep Temp = 370 C.

| Run ID | Press, (torr) | Power, (watt) | DMSCP, (sccm) | He, (sccm) | Dep Rate (Å/min) | RI | Post-anneal K* Kavg* | STD |
|---|---|---|---|---|---|---|---|---|
| 5-1 | 7.5 | 850 | 150 | 300 | 5634 | 1.7744 | 3.946 | 0.162 |
| 5-2 | 9.2 | 700 | 150 | 300 | 2746 | 1.7158 | 3.662 | 0.114 |
| 5-3 | 9.2 | 550 | 150 | 420 | 1288 | 1.7352 | 4.137 | 0.087 |
| 5-4 | 9.2 | 700 | 150 | 420 | 2690 | 1.7407 | 3.868 | 0.169 |

*The error of measured K is +0/−10%.

TABLE 3

Composition of DMSCB based a-SiCO:H and a-SiC:H films

| Process | Si | N | H | O | C | Atom density (atoms/cm$^2$) | Density (g/cm$^2$) | O/Si | C/Si | LKG (Å/cm$^2$ @ 1 MV/cm) | Vbd (mv/cm @ 1 mA/cm$^2$) |
|---|---|---|---|---|---|---|---|---|---|---|---|
| DMSCB a-SiCO:H | 0.11 | 0 | 0.46 | 0.1 | 0.33 | 1.78E+18 | 1.15 | 0.91 | 3 | $7.67 \times 10^{-11}$ | >4 |
| DMSCB a-SiC:H | 0.16 | 0 | 0.4 | 0.08 | 0.36 | 4.09E+17 | 1.12 | 0.5 | 2.25 | $2.39 \times 10^{-11}$ | >4 |
| TMS a-SiCO:H | 0.15 | 0.02 | 0.36 | 0.15 | 0.32 | 6.55E+22 | 1.17 | 1.00 | 2.14 | $3 \times 10^{-10}$* | >4 |
| TMS a-SiC:H | 0.30 | 0 | 0.14 | 0.05 | 0.48 | 7.47E+22 | 1.85 | 0.17 | 1.6 | $5.33 \times 10^{-9}$ | 2.5 |

*Measurement was at 0.5 MV/cm inducing a reaction between the cyclic silane compound and oxygen providing gas at a temperature of 25° C. to 500° C.;
wherein there is 0.1 to less than 10 volume parts oxygen providing gas per volume part of cyclic silane compound present during the reaction to provide a film on the substrate comprising hydrogen, silicon, carbon and oxygen having a dielectric constant in the range of 2.0 to 3.2.

2. The method as claimed in claim 1 wherein the cyclic silane compound is selected from

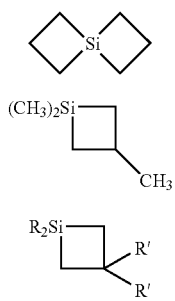

where each R is independently selected from the group consisting of hydrogen, fluorine, and hydrocarbon radicals having at least 1 carbon atom and each R' is independently selected from the group consisting of hydrogen and hydrocarbon radicals having at least one carbon atom.

3. The method as claimed in claim 1 wherein the cyclic silane compound is a silicon-containing cyclobutane.

4. The method as claimed in claim 3 wherein the silicon-containing cyclobutane has the formula

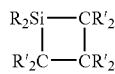

where each R is independently selected from the group consisting of hydrogen, fluorine, and hydrocarbon radicals having at least 1 carbon atom and each R' is independently selected from the group consisting of hydrogen and hydrocarbon radicals having at least 1 carbon atom.

5. The method as claimed in claim 3 wherein the silicon-containing cyclobutane has the formula

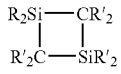

where each R is independently selected from the group consisting of hydrogen, fluorine, and hydrocarbon radicals having at least one 1 carbon atom and each R' is independently selected from the group consisting of hydrogen and hydrocarbon radicals having at least 1 carbon atom.

6. The method as claimed in claim 1 wherein the oxygen providing gas is selected from the group consisting of oxygen, air, peroxides, sulfur dioxide, carbon monoxide, carbon dioxide, nitrous oxide and nitric oxide.

7. The method as claimed in claim 1 wherein the oxygen providing gas is nitrous oxide.

8. The method as claimed in claim 1 wherein the cyclic silane compound is dimethylsilacyclobutane and the oxygen providing gas is nitrous oxide.

9. The method as claimed in claim 1 wherein the amount of oxygen providing gas is 0.2 to 7 volume parts of oxygen providing gas per volume part of cyclic silane compound.

10. The method as claimed in claim 1 wherein the reaction is induced by exposing the reactive gas mixture to plasma.

11. The method as claimed in claim 10 wherein the reaction is induced by exposing the reactive gas mixture to plasma at a power of 20 to 1000 W, a pressure of 1 to 10,000 mTorr, and a temperature of 25 to 500° C.

12. The method as claimed in claim 1 wherein the film has a dielectric constant in the range of 2.2 to 2.8.

13. The method as claimed in claim 1 wherein the film has a dielectric constant in the range of 2.5 to 2.8.

14. The method as claimed in claim 1 wherein the reactive gas mixture additionally comprises a carrier gas.

15. The method as claimed in claim 1 wherein the hydrogenated silicon oxycarbide film has a thickness of 0.01 to 10 μm.

16. The method as claimed in claim 1 wherein the hydrogenated silicon oxycarbide film has a thickness of 0.5 to 3.0 μm.

17. The method as claimed in claim 1 wherein the substrate is a semiconductor substrate.

18. The method as claimed in claim 1 wherein the substrate is selected from a liquid crystal device, a light emitting diode display device and an organic light emitting diode display device.

19. The method as claimed in claim 1 wherein the amount of oxygen providing gas is increased or decreased during the reaction between the cyclic silane compound and the oxygen providing gas to produce a film containing successive layers selected from the group consisting of $SiO_2$, H:SiOC and SiC:H.

20. The method as claimed in claim 1 wherein the reaction is induced by exposing the reactive gas mixture to confined, low-pressure microwave frequency plasma combined with RF frequency excitation.

21. A semiconductor device having thereon a film produced by the method as claimed in claim 1.

22. The method as claimed in claim 3 wherein the silicon-containing cyclobutane is dimethylsilacyclobutane.

23. The method as claimed in claim 3 wherein the silicon-containing cyclobutane is dimethylsilacyclopentane.

* * * * *